United States Patent
Watts, Jr.

[11] Patent Number: 6,043,762
[45] Date of Patent: Mar. 28, 2000

[54] HARDWARE BIT CODER

[75] Inventor: Charles E. Watts, Jr., Crowley, Tex.

[73] Assignee: Fairchild Semiconductor Corp., South Portland, Me.

[21] Appl. No.: 09/072,897

[22] Filed: May 5, 1998

[51] Int. Cl.[7] .................................................. H03M 7/00
[52] U.S. Cl. ............................................. 341/50; 341/106
[58] Field of Search .................................. 341/55, 51, 52, 341/106

[56] References Cited

U.S. PATENT DOCUMENTS

| | | |
|---|---|---|
| 4,222,103 | 9/1980 | Chamberlin . |
| 4,380,821 | 4/1983 | Eckhardt . |
| 5,193,210 | 3/1993 | Nicholas et al. . |
| 5,218,693 | 6/1993 | Ogita . |
| 5,233,628 | 8/1993 | Rappaport et al. . |
| 5,265,259 | 11/1993 | Satou et al. . |
| 5,270,713 | 12/1993 | Isono ........................................ 341/55 |
| 5,325,341 | 6/1994 | Viot et al. . |
| 5,327,580 | 7/1994 | Vignali et al. . |
| 5,379,031 | 1/1995 | Mondrosch et al. . |
| 5,471,663 | 11/1995 | Davis . |
| 5,577,235 | 11/1996 | Mitra . |
| 5,592,113 | 1/1997 | Quiet et al. . |
| 5,600,314 | 2/1997 | Oliveros . |
| 5,631,592 | 5/1997 | Schwarz . |
| 5,636,266 | 6/1997 | Ranganath et al. . |
| 5,652,783 | 7/1997 | Keba et al. . |

*Primary Examiner*—Brian Young
*Attorney, Agent, or Firm*—Pierce Atwood; Chris A. Caseiro

[57] ABSTRACT

A dedicated hardware block in the form of a hardware bit coder device for generating IR/RF bit coding protocols. The hardware bit coder device is configurable to any user-defined frame length and single or multiple frame strings. The device can emulate substantially any desired bit coding pattern. The device uses a programmable signal shaping technique that eliminates the need to develop complex bit coding protocols in software. Using the hardware bit coder device of the present invention directly reduces the amount of program memory required by the microcontrollers to accomplish data decoding and also frees up the microcontroller resources for other purposes. The hardware bit coder includes a set of two pattern registers, one corresponding to a high data bit value and the other to a low data bit value. The particular pattern to be shifted out for transmission is defined by the particular data signal. Pattern transmission rate and period are selectable.

15 Claims, 4 Drawing Sheets

HARDWARE BIT CODER

BACKGROUND OF THE INVENTION

1. Field of the Invention

The present invention relates to the field of coded data transmissions. More particularly, the present invention relates to a device for providing an alternative to reliance on software for the encoding of data to be transmitted. More particular yet, the present invention involves a device embodied in hardware that encodes the data to be transmitted. The use of hardware and nominal programming creates a hardware bit coder according to the present invention that is independent of microcontroller resources and time.

2. Description of the Prior Art

Contemporary applications of computers and electronic devices continue to increase in complexity. Increased features of such applications place a premium on fast data transmission with minimal time and energy requirements. Finding the solutions to increased data transmission while reducing time and energy requirements continues to place demands upon the system's designers and software engineers who resort to increasingly complex programming software. The problem inherent in following a software solution is that any increase in data transmission is typically countered, and oftentimes outweighed, by an overall decrease in system efficiency. This is readily apparent in the microcontroller resources that must be used to run the increasingly complex software required to perform demanded tasks. Increased use of microcontroller resources directly impacts vital aspects of the system such as the total amount of program memory required by the microcontroller to accomplish the software-based task. Use of microcontroller resources is therefore of primary concern.

In the field of coded data transmission, there exists a predominant use of software manipulation to encode and decode data bits. That is, it is often necessary to enable a data receiver to confirm the value (1 or 0) of a particular bit. As bit transmission rates continue to increase, particularly in the area of Infrared/Radio Frequency (IR/RF) transmissions, the amount of time that a receiver has to recognize the bit value is reduced. In order to aid the receiver—i.e., some sort of processing system—in accurately recognizing an incoming bit value it is necessary to assign some more-readable coded value to that incoming bit. Typically, that coded value is a series of bits equivalent to the incoming bit value. That coded value has been created when a processor writes data to a data register. The data is then encoded in a selected format and then shifted out for transmission. For example, if a data bit is a high (1) value, various types of protocol software have been developed so as to encode that bit as a signal, such as 1010 for example, that is used to define that particular bit value. A similar type of corresponding bit series, such as 0111, would be used to generate a waveform equivalent to a low (0) value. It can be seen that a waveform is created as a function of a single bit value. Since a suitable processing system on the receiving end can more easily comprehend accurately the distinction between those two distinct waveforms, the accuracy of the reading of the incoming signals is enhanced. Similarly, at the receiving end there is also means for decoding the encoded signal in order to output a single bit value for processing.

As indicated, the task of encoding data has been left primarily to software developers. For that reason, standardized protocols have been developed In particular, a variety of protocols have been developed that allow programmers to design software to deal with any given application and related design specifications. Such protocols include Manchester, PWM, NRZ, and other modes. While using software is a useful manner with which to handle coded data bits, software manipulation is inherently problematic as such software occupies microcontroller time at the expense of other functions. Such consumption of microcontroller resources is in addition to the difficulties common to software such as, but not limited to, compatibility concerns and de-bugging issues.

With the increasingly complex, software-based prior-art in mind, there is revealed a need for a simpler approach to data bit coding. What is needed is a device that substantially reduces or eliminates the need for software to encode one or more bits of data to be transmitted. What is also needed is such a device that operates substantially independent of microcontroller resources to the extent reasonably possible. Further, what is needed is a single device capable of handling data streams coded in a variety of protocols. Still further, what is needed is a device that emulates substantially all bit coding protocols with nominal reliance on programming.

SUMMARY OF THE INVENTION

It is an object of the present invention to provide a bit coder device that provides a simpler approach to data bit coding that relies substantially entirely on hardware. Another object of the present invention is to provide for such a device that utilizes hardware to encode data to such an extent that the need for software is substantially eliminated. Yet another object of the present invention is to provide such a device that is independent of microcontroller resources and thus allocates these resources to non-coding functions. Still another object of the present invention is to provide such a device that is singly capable of handling data streams coded in a variety of protocols. It is also an object of the present invention to provide a device that emulates substantially all bit coding protocols with minimal programming of the device.

The hardware bit coder device of the present invention includes a dedicated hardware block for generating IR/RF bit coding. It is software programmable and can be configured to emulate almost any desired bit coding format. The hardware bit coder device preferably has a series of memory-mappable registers associated with it and designed to be linked so as to produce an emulation through hardware of common RF bit formats by using a programmable signal shaping technique. The two principal registers are a first pattern register and a second pattern register. Each of these registers is programmed with a unique programmable pattern. The first pattern register has a bit pattern corresponding to a bit value of 1, while the second pattern register has a bit pattern corresponding to a bit value of 0. A decision register first receives incoming data bit by bit from the processor and triggers the outputting for transmission of the bit pattern from either of the two pattern registers as a function of recognizing the incoming bit.

The use of the noted bit pattern registers created in hardware eliminates the need for substantial protocol software. This aids the processing system that is to transmit the coded signal. The hardware bit coder of the present invention provides in hardware a clock dividing set of registers to slow the rate of delivery of the coded signal from the processor to a rate suitable for transmission. Specifically, a standard clock divider reduces the system clock that is standard in any processing system, including most any microcontroller. A programmable prescale register provides for optional additional slowing of the effective clock rate by defining the period of time, through the selection of the number of clock cycles, permitted for reading of the bits being patterned and shifted out for transmission. Additional programmable registers may be added to the coder of the present invention to enable selection of the number of patterned bits to be shifted out of the first and second pattern registers as well as to define the total bit pattern length to be transferred from each pattern and the rate of transfer of each pattern.

Through the use of the hardware registers coupled in the manner to be defined herein, the present invention provides a means for emulating bit coding patterns of any protocol without costly and resource-consuming coding software.

It is to be understood that other objects and advantages of the present invention will be made apparent by the following description of the drawings according to the present invention. While a preferred embodiment is disclosed, this is not intended to be limiting. Rather, the general principles set forth herein are considered to be merely illustrative of the scope of the present invention and it is to be further understood that numerous changes may be made without straying from the scope of the present invention.

DETAILED DESCRIPTION OF THE PREFERRED EMBODIMENT

Figure 1:
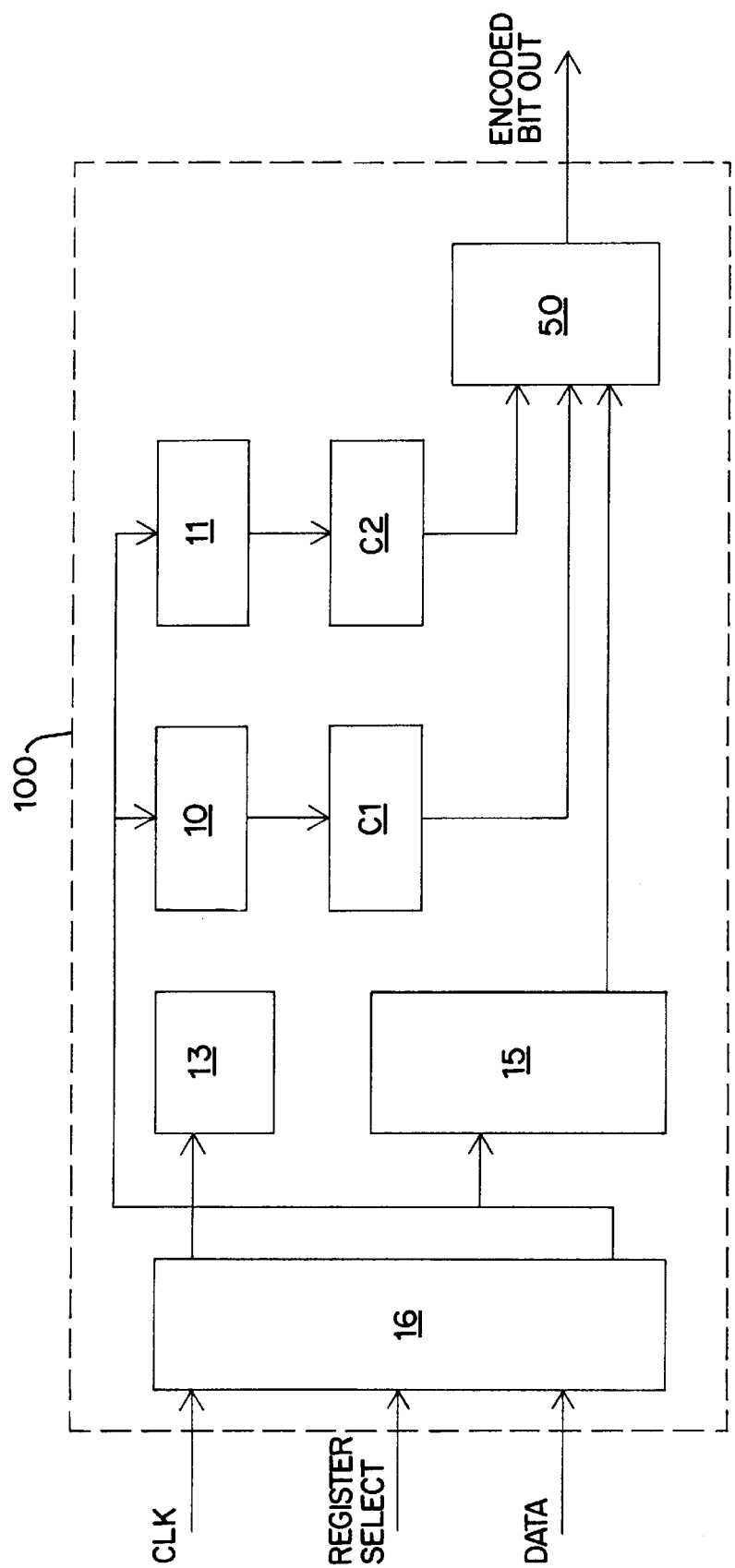
FIG. 1 is a first simplified block diagram of the hardware bit coder of the present invention shown in context.

FIG. 1 provides a simplified illustration of a hardware bit coder 100 of the present invention. The coder 100 includes a control logic circuit 16 for receiving from a processor core a system clock signal CLK, a data stream DATA, and Register Select commands directed to controlling operation of registers associated with the coder 100. The coder 100 includes a PRESCALE register 13 for selectable fixing of an internal clock rate associated with the rate of data transmission out of the coder 100 at Encoded Bit Out in a preselected format. The coder 100 further includes a DATA register 15, the output of which of which is directed to decision register 50 along with the outputs of a first counter C1 and a second counter C2. The output at Encoded Bit Out is determined by the data value output by DATA register 15. In the preferred embodiment of the present invention, when the DATA register 15 output is a high bit value, the decision register 50 will deliver the pattern associated with counter C1. When DATA register 15 outputs a low bit value, decision register 50 delivers the second counter C2 patter. That is, when selected, counter C1 shifts out a first programmed bit pattern corresponding to a pattern associated with X-PATTERN register 10. Similarly, counter C2 shifts out a second programmed bit pattern corresponding to a pattern associated with Y-PATTERN register 11.

Figure 2:
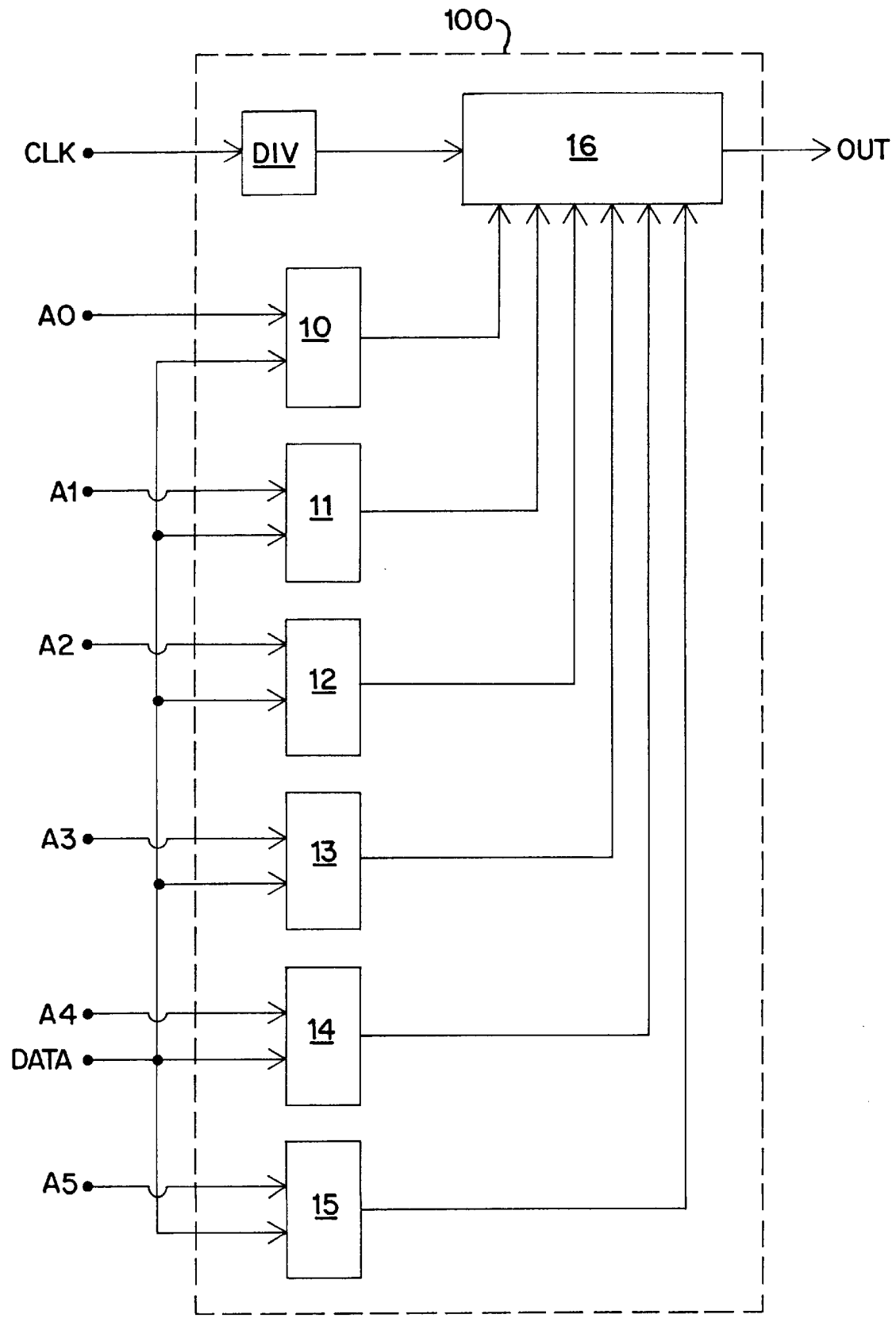
FIG. 2 is a second block diagram of the hardware bit coder of the present invention.

FIG. 2 shows a second block diagram of the hardware bit coder 100 in accordance with the present invention. The coder 100 may include a divide-by-four subcircuit DIV, which may simply be a pair of flip flops or other suitable circuitry well known by those skilled in the art, into which the system clock CLK is directed. This division by four via the DIV block is required to bring a system clock that typically operates on the order of 1 MHz down to the kHz range. This is desirable as it is preferred to operate the coder 100 in the kHz range. However, it is to be understood that a system clock of lower operating frequency may not require division, or it may require division by less or more than four, dependent upon the particular hardware and system tasking. Assuming, however, that a divide-by-four subcircuit is used, the reduced clocking signal from the DIV block is then routed into control logic 16. The control logic 16 will be discussed later with reference to FIG. 3.

With continued reference to FIG. 2, the coder 100 also includes the X-PATTERN register 10. The X-PATTERN register 10 functions to shift out a pre-defined bit pattern programmed via input A0 if and only if a single data bit to be coded (i.e., the test bit) at data bit input DATA is "1". Once the predefined pattern is shifted out, the X-PATTERN register 10 will automatically be reloaded with the preshifted value. The Y-PATTERN register 11 is also shown in FIG. 2. As with the X-PATTERN register 10, its predefined pattern, configured via input A1, will be shifted out if and only if the single data bit to be coded at the data bit input DATA is "0". Once the bit series of the Y-PATTERN register 11 is shifted out, the register 11 will automatically be reloaded with the preshifted value. It is to be noted that DATA is a standard data bus linked to all registers, as is common in most processing systems.

The coder 100 of the present invention also includes a BPSELECT register 12 which is programmed via selectable input A2 to select a bit period. That is, the number of clock cycles within which a particular bit pattern can be shifted out of either register 10 or register 11. The high nibble (four-bit group) and low nibble of register 12 can be initially programmed by the user. Within the BPSELECT register 12, the lower 3 bits control the high period and the lower 3 bits control the low period. The bit period preferably ranges from 1 to 8 clock periods. Of course, the duration of the bit period is a function of the system clock rate and the presence or absence of the divider DIV.

The coder 100 further includes the PRESCALE register 13 programmable through input A3. The PRESCALE register 13 is a divide-by counter, preferably with a divide-by-256 capability. Thus, in the preferable design of the present invention, the user may load at A3 a binary value equivalent to any number between 0 and 256 into the PRESCALE register 13 in order to set a desired internal clock rate. The coder also includes a programmable CONTROL register 14 that performs three primary functions each of which is defined by an input at A4. First, the CONTROL register 14 is used to start and stop the coder 100. That is control logic may be programmed to define the operation of the coder 100. Second, the CONTROL register 14 is used to select the desired frame length of the bit stream to be decoded, which frame length is predefined. Third, the CONTROL register 14 is used to select either single or multiple frame strings as a function of the length of the data string to be output. In most instances the registers will likely be eight-bit registers. Therefore, when data strings of greater than eight bits are to be shifted out of the coder 100 for transmission, the CONTROL register 14 signals to the processor that one or more following sets of bits are to be shifted along with the first set. This signalling preferably occurs such that the following set of bits is shifted in prior to shifting out the last bit of the prior set.

Input of coded data from an internal data bus DATA and signal A4 are routed to the CONTROL register 14 for throughput of the coded data stream in an ordered fashion via the decision register 50 of FIG. 1. In this manner, any desired pattern can be selected so that the coder 100 can emulate substantially any bit coding format. A DATA register 15 programmable via input AS is shown that holds an 8-bit value from the data stream. The coder 100 uses this 8-bit value to generate a pulse-width-modulation format related to the particular signal encoding protocol defined. Of course, this configuration can be modified as desired without deviating from the primary scope of the invention in that programming of the DATA register 15, as with the other registers described herein, may be modified to conform to the particular situation encountered by the user.

Figure 3:
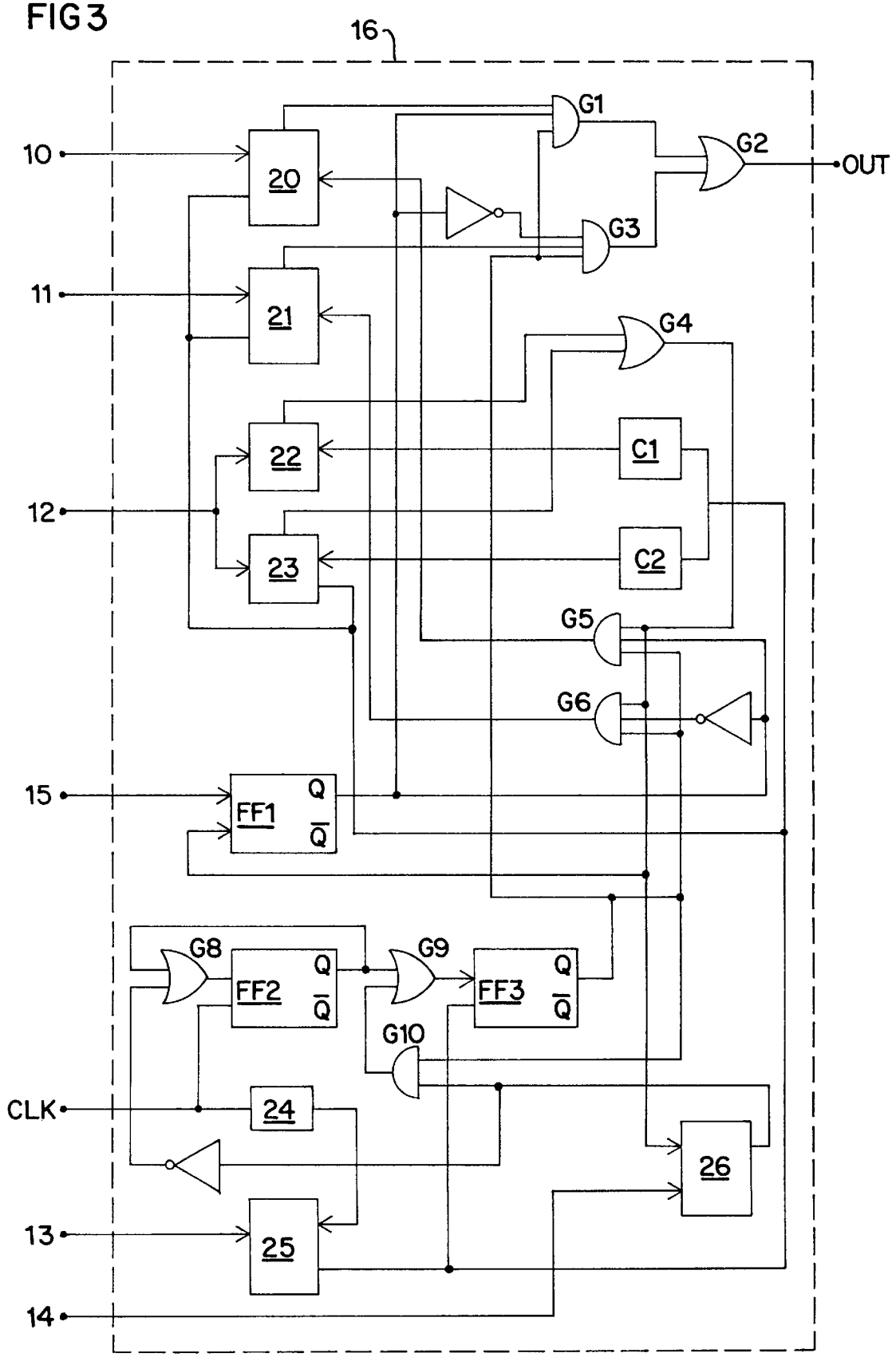
FIG. 3 is a simplified schematic diagram of the control logic circuitry of the hardware bit coder of the present invention as shown in FIG. 2.

In FIG. 3, the control logic block 16 of the present invention is detailed at the circuit level. Inputs 10 through 15 and CLK in FIG. 3 correspond to the numbered blocks 10 through 15 and CLK in FIG. 2. The outputs of registers 10–15 are, effectively, the inputs 10–15 to logic block 16 as shown in FIG. 3. The logic block 16 includes an X-shifter 20 that receives the output of the X-PATTERN register 10 and a Y-shifter 21 that receives the output of the Y-PATTERN register 11. While the X-shifter 20 and the Y-shifter 21 may be embodied in any suitable format, they each are preferably created by way of a series of coupled flip flops so as to generate cascading shifters in a manner well known to those skilled in the art. X-shifter 20 is triggered by AND gate G5 to output a serial transmission of the x-pattern output from register 10 corresponding to the coding for a DATA input of 1 delivered to AND gate G1 most significant bit first. Y-shifter 21 is triggered by AND gate G6 to output a serial transmission of the y-pattern output from register 11 corresponding to the coding for a DATA input of 0 delivered to AND gate G3 most significant bit first.

With continuing reference to FIG. 3, the programmed bit period from the BPSELECT register 12 is routed to an X-match comparator 22 and to a Y-match comparator 23. It is to be noted that the period of the shifting of the X pattern may be independent of the period defined for the shifting of the Y pattern. The X-match comparator 22 is also coupled to an X-counter C1. The X-counter C1 is loaded with counter values associated with a reload prescale register 25 to be described herein and that are shifted into the X-match comparator 22. The Y-match comparator 23 is also coupled to a Y-counter C2. As with the X-counter C1, the Y-counter C2 is loaded with counter values associated with the reload prescale register 25. Outputs of X-match comparator 22 and Y-match comparator 23 are combined in an OR gate G4, the output of which is transmitted to AND gate G5 corresponding to the X-shifter 20, and to AND gate G6 corresponding to the Y-shifter 21. As can be seen, this arrangement determines the operation of the shifters 20 and 21 relative to the desired bit period chosen by the user.

It is to be further noted that the remaining inputs to gates G5 and G6 come from test flip flop FF1. Test flip flop FF1 is triggered by the output value of the DATA register 15 and is set/reset by the output of OR gate G4. The inverted output of test flip flop FF1 and the output of system flip flop FF3 are also transmitted to gate G3. The outputs of gates GI and G3 are then ORed together at OR gate G2, such that when the coder 100 is enabled, there will always be an output OUT from gate G2 that is either the x-pattern or the y-pattern of coded data to be transmitted from the processor. For the most part, in the preferred embodiment of the present invention, gates G1–G3 embody the decision register 50 shown in FIG. 1.

The system clock CLK signal, which may be routed into a divide-by-four divider 24 corresponding to divider DIV of FIG. 2, is combined with the PRESCALE register output 13 at the reload prescale register 25 to produce the RF clock signal fed to counters C1 and C2, shifters 20 and 21, and Y-match 23. CONTROL register output 14 routes its control data value to a data counter 26 which combines with the bit period match value from OR gate G4 to produce an output directed to master flip flop FF2, preferably by way of OR gate G8. Similarly, the data counter 26 output is also directed to system flip flop FF3 by way of AND gate G10 and OR gate G9. The operation of system flip flop FF3 is also dependent upon the output of master flip flop FF2 such that a HIGH output value effectively turns on AND gate G5, while a LOW output value effectively turns on AND gate G6. A summary of an example of the operation of the coder 100 follows.

In operation, data written to input DATA is shifted bit by bit into each of the five registers noted. If the active bit shifted in is 1, the pattern in the X-PATTERN register 10 will be shifted out of the G2 output pin (most significant bit to least significant bit). Similarly, if the active bit is 0, the pattern in the Y-PATTERN register 11 is shifted out of the G2 output pin (again, most significant bit to least significant bit).

The number of bits of the pattern registers 10 and 11 that will be shifted (8 bits maximum) is determined by the lower six bits of the BP SELECT register 12. The BX2 to BXO bits set the length of the output of the X-PATTERN register 10 while the BY2 to BYO bits set the length of the output of the Y-PATTERN register 11. The number of bits shifted out of the DATA register 15, that is, the frame length, is determined by the lower three bits of the CONTROL register 14. The PRESCALE register 13 is an 8-bit register programmed to select the desired RF clock frequency. For a system clock of 1 MHz that has been divided by four with divider DIV, an RF clock frequency that ranges between 0.976 kHz to 250 kHz is produced. Once the PRESCALE register 13 is programmed, the desired RF frequency will be maintained as long as the coder 100 is enabled or as long as the device is powered. TABLE 1 provides a summary of the bit values that may be programmed in the relevant registers.

TABLE I

| Bit 7 | Bit 6 | Bit 5 | Bit 4 | Bit 3 | Bit 2 | Bit 1 | Bit 0 |
|---|---|---|---|---|---|---|---|
| | | X-PATTERN Register | | | | | |
| 7 | 6 | 5 | 4 | 3 | 2 | 1 | 0 |
| | | Y-PATTERN Register | | | | | |
| 7 | 6 | 5 | 4 | 3 | 2 | 1 | 0 |
| | | BPSELECT Register | | | | | |
| 0 | 0 | BY2 | BY1 | BY0 | BX2 | BX1 | BX0 |
| | | PRESCALE Register | | | | | |
| PS7 | PS6 | PS5 | PS4 | PS3 | PS2 | PS1 | PS0 |

As noted, the CONTROL register 14 is used to Start, Stop, and Select the output frame length of the hardware bit coder device. Once data framing bits FM2 to FM0 of that register shown in TABLE 2 are programmed and a START bit is set, the selected frame length will be serially transmitted out of the gate G2 output. In one example, a data write of some particular hexadecimal value to the CONTROL register 14 will start an operation. When the last bit of the DATA is shifted into the DATA register 15, an "on" flag bit OFLAG will be set, indicating that a data shifting operation is about to be completed. If the desired frame of data to be coded is greater than 8 bits, the CONTROL register 14 will be programmed to reload the DATA register 15 with the next frame sequence and write to the START bit immediately after a reset flag bit FRFLG is reset to zero but before the X-PATTERN register 10 and the Y-PATTERN register 11 shift sequences are completed. This will reset the OFLAG to zero and the hardware bit coder 100 will continue operating. The bit arrangement of the CONTROL register 14 is shown in TABLE 2.

TABLE 2

CONTROL Register

| Bit 7 | Bit 6 | Bit 5 | Bit 4 | Bit 3 | Bit 2 | Bit 1 | Bit 0 |
|---|---|---|---|---|---|---|---|
| X | X | START | OFLAG | FRFLG | FM2 | FM1 | FM0 |

Figure 4:
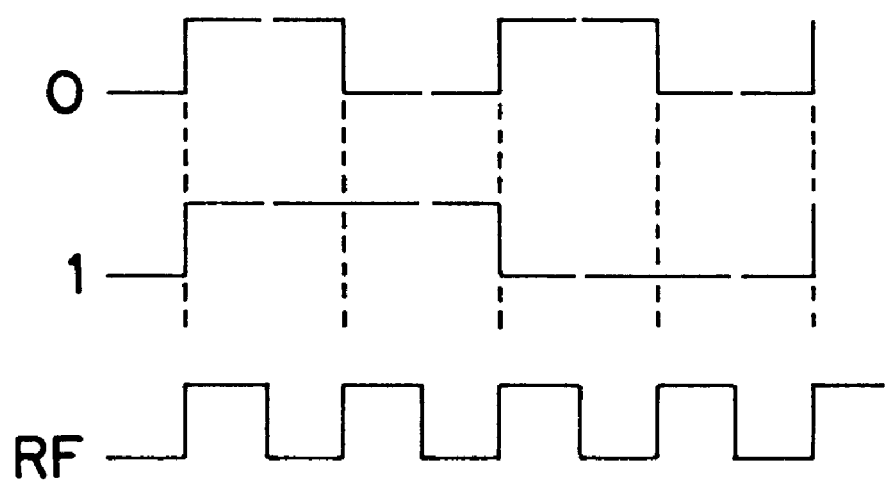
FIG. 4 is an sample pattern after operation of the hardware bit coder of the present invention has started.

A specific example of a bit coding achieved through the use of the structural coder 100 of the present invention is shown in FIG. 4 in relation to the following simple example. Using well-known programming techniques, a hexadecimal input of 24 H to the BPSELECT register 12 results in the selection of a bit period of T=4 RF. A hexadecimal value of 03 H is input into the X-PATTERN register 10, and a value of 05 H is input into the Y-PATTERN register 11. The data DATA to be encoded is input into the DATA register 15. If bit 7=0 then the top waveform of FIG. 4 will be observed. If bit 7=1, then the middle waveform will be observed. Finally, a hexadecimal value of 20H is input into the CONTROL register 14 to select the frame length and start the operation of the coder 100.

It should be understood that the preferred embodiments mentioned here are merely illustrative of the present invention. Numerous variations in design and use of the present invention may be contemplated in view of the following claims without straying from the intended scope and field of the invention herein disclosed.

I claim:

1. A hardware bit coder for encoding data to be transmitted, said hardware bit coder being coupled to a data bus, said hardware bit coder comprising:
   a. a data register for receiving a stream of data signals from the data bus;
   b. a control logic circuit coupled to said data register, a system clock and a hardware bit coder output; and
   c. a programmable means for defining signal patterns associated with a high value bit and a low value bit of data from the stream of data signals, said programmable means being coupled between the data bus and said control logic circuit,
   wherein said programmable means is loaded with said data and encodes each low value bit of data from the data stream with a corresponding first selectable pattern of bits and each high value bit of data from the data stream with a corresponding second selectable pattern of bits.

2. The hardware bit coder as claimed in claim 1 further comprising a clock dividing circuit coupled between said control logic circuit and said system clock.

3. The hardware bit coder as claimed in claim 2 further comprising a bit-period select register coupled to said control logic circuit, wherein said bit-period select register is designed to define a first period associated with said first selectable pattern of bits and a second period associated with said second selectable pattern of bits.

4. The hardware bit coder as claimed in claim 3 wherein said first period and said second period are not equal.

5. The hardware bit coder as claimed in claim 1 further comprising a prescale register coupled to said control logic circuit, wherein said prescale register is designed to define an internal clock rate associated with operation of said control logic circuit.

6. The hardware bit coder as claimed in claim 1 wherein said programmable means for defining signal patterns associated with said high value bit and said low value bit of data from the stream of data signals includes a first memory-mappable pattern register associated with said high value bit and a second memory-mappable pattern register associated with said low value bit, wherein said first pattern register is programmable with said first selectable pattern of bits and said second pattern register is programmable with said second selectable pattern of bits.

7. The hardware bit coder as claimed in claim 6 wherein said control logic circuit includes a first shifter coupled to said first pattern register and a second shifter coupled to said second pattern register.

8. The hardware bit coder as claimed in claim 7 further comprising a bit-period select register coupled to said control logic circuit, wherein said bit-period select register is designed to define a first period associated with said first selectable pattern of bits and a second period associated with said selectable pattern of bits, wherein said control logic circuit further includes a first-pattern comparator and a second-pattern comparator coupled to said bit-period select register.

9. The hardware bit coder as claimed in claim 8 wherein said control logic circuit further includes further comprising a first counter coupled to said first-pattern comparator and a second counter coupled to said second-pattern comparator, wherein said first counter and said second counter are coupled to said hardware bit coder output.

10. The hardware bit coder as claimed in claim 1 further comprising a programmable control register coupled to said control logic circuit, wherein said programmable register is designed to define a bit pattern frame length.

11. The hardware bit coder as claimed in claim 10 wherein said control register is further designed to define the number of frames of encoded data to be shifted out of said hardware bit coder.

12. A method for encoding data of a stream of data signals to be transmitted, wherein the method is based substantially entirely on the use of hardware, the method comprising the steps of:
   a. delivering data from a stream of data signals to a data register of bit coder circuitry, wherein said bit coder circuitry includes an encoded data output;
   b. defining in a first pattern register a first signal pattern associated with a high value bit of the data from the stream of data signals;
   c. defining in a second pattern register a second signal pattern associated with a low value bit of the data from the stream of data signals; and
   d. shifting out of said encoded data output either said first signal pattern or said second signal pattern as a function of whether a data bit to said data register is a high value bit or a low value bit.

13. The method as claimed in claim 12 wherein said first signal pattern and said second signal pattern are individually selectable patterns of bits.

14. The method as claimed in claim 13 further comprising the step of defining a first period associated with said first selectable pattern of bits and a second period associated with said second selectable pattern of bits.

15. The method as claimed in claim 14 further comprising the step of defining an internal clock rate associated with a rate of transmission of said first selectable pattern of bits and said second selectable pattern of bits.

* * * * *